(12) United States Patent
Acharya et al.

(10) Patent No.: US 10,579,454 B2
(45) Date of Patent: Mar. 3, 2020

(54) DELAY FAULT TESTING OF PSEUDO STATIC CONTROLS

(71) Applicant: TEXAS INSTRUMENTS INCORPORATED, Dallas, TX (US)

(72) Inventors: Aravinda Acharya, Bangalore (IN); Wilson Pradeep, Karanataka (IN); Prakash Narayanan, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 128 days.

(21) Appl. No.: 15/630,516

(22) Filed: Jun. 22, 2017

(65) Prior Publication Data

US 2018/0307553 A1 Oct. 25, 2018

(30) Foreign Application Priority Data

Apr. 20, 2017 (IN) .............................. 201741014017

(51) Int. Cl.
| | | |
|---|---|---|
| *G06F 11/07* | (2006.01) | |
| *G01R 31/317* | (2006.01) | |
| *G01R 31/3185* | (2006.01) | |
| *G11C 29/14* | (2006.01) | |
| *G11C 29/50* | (2006.01) | |
| *G11C 29/32* | (2006.01) | |
| *G11C 29/20* | (2006.01) | |
| *G11C 29/12* | (2006.01) | |

(Continued)

(52) U.S. Cl.
CPC .... *G06F 11/0757* (2013.01); *G01R 31/31725* (2013.01); *G01R 31/31858* (2013.01); *G11C 29/12015* (2013.01); *G11C 29/14* (2013.01); *G11C 29/20* (2013.01); *G11C 29/32* (2013.01); *G11C 29/50012* (2013.01); *G11C 29/56012* (2013.01); *G01R 31/14* (2013.01); *G06F 11/261* (2013.01); *G11C 29/10* (2013.01); *G11C 29/36* (2013.01); *G11C 2029/1204* (2013.01); *G11C 2029/3202* (2013.01)

(58) Field of Classification Search
CPC ............... G06F 11/0757; G06F 11/261; G01R 31/31858; G01R 31/31725
See application file for complete search history.

(56) References Cited

U.S. PATENT DOCUMENTS

| | | | | |
|---|---|---|---|---|
| 3,300,764 A | * | 1/1967 | Doelz ..................... | G06F 15/78 307/115 |
| 5,309,446 A | * | 5/1994 | Cline ............... | G01R 31/31701 365/201 |

(Continued)

*Primary Examiner* — Phung M Chung
(74) *Attorney, Agent, or Firm* — Michelle F. Murray; Charles A. Brill; Frank D. Cimino

(57) ABSTRACT

A circuit includes a dynamic core data register (DCDR) cell that includes a data register, a shift register and an output circuit to route the output state of the data register or the shift register to an output of the DCDR in response to an output control input. A clock gate having a gate control input controls clocking of the shift register in response to a first scan enable signal. An output control gate controls the output control input of the output circuit and controls which outputs from the data register or the shift register are transferred to the output of the output circuit in response to a second scan enable signal. The first scan enable signal and the second scan enable signal to enable a state transition of the shift register at the output of the DCDR.

15 Claims, 4 Drawing Sheets

(51) Int. Cl.
  *G11C 29/56* (2006.01)
  *G06F 11/26* (2006.01)
  *G01R 31/14* (2006.01)
  *G11C 29/10* (2006.01)
  *G11C 29/36* (2006.01)

(56) References Cited

U.S. PATENT DOCUMENTS

| | | | | |
|---|---|---|---|---|
| 5,907,562 A * | 5/1999 | Wrape | ............ | G01R 31/318555 365/201 |
| 6,073,254 A * | 6/2000 | Whetsel | ......... | G01R 31/318536 714/30 |
| 9,030,398 B2 * | 5/2015 | Chung | ................. | G09G 3/3688 345/100 |
| 2012/0159275 A1 * | 6/2012 | Whetsel | ......... | G01R 31/318594 714/733 |

* cited by examiner

DELAY FAULT TESTING OF PSEUDO STATIC CONTROLS

CROSS-REFERENCE TO RELATED APPLICATION

This application claims the benefit of India Provisional Patent Application 201741014017 filed on Apr. 20, 2017, and entitled DELAY FAULT TESTING OF PSEUDO STATIC CONTROLS, the entirety of which is incorporated by reference herein.

TECHNICAL FIELD

This disclosure relates to electrical circuits, and more particularly to a dynamic core data register circuit where separate scan enable signals facilitate delay fault testing of a pseudo static controls.

BACKGROUND

For automotive integrated circuit devices, it is desirable that high test-coverage is achieved for both static and delay faults yet still keeping the test-cost under control to meet the stringent safety standards. As a measure to achieve close to zero defective parts per million for this class of devices, typically the test coverage targets are set as high as greater than 99% for static fault testing and greater than 95% delay fault testing. Static testing refers to detecting whether or not a given node in the design is fixed at the one or zero state (e.g., due to shorted node). Delay fault testing refers to measuring a transition event (e.g., response of a flip flop to a clock edge) to determine whether or not the transition event occurred in a desired timing window.

In standard scan designs, delay faults are typically tested using skewed-load also referred to as launch off shift (LOS) method or using broadside also referred to as a launch off capture method (LOC). Both methods launch transitions at the input of combinational block in different manner for the same fault detection. In the case of LOC, a scan-enable signal goes low post of last shift clock cycle and the launch and capture of the transition would happen along the functional path of the circuit. In LOS, the last shift clock is used to launch a transition from the scan-shift path onto the combinational block. In LOS, the fault activation path or scan path is controllable from the input of scan chain while in LOC, controllability of launching a transition at a fault site is less as it depends on the functional response of logic blocks to an initialize vector. Thus, LOS results in better fault coverage and less testing patterns than LOC. A disadvantage of LOS is that it requires the scan-enable signal to switch at-speed. Since last shift happens with a fast clock, the entire design under test will become active resulting in average power in the launch cycle to go very high. Also, the last shift at high speed clock will force additional timing requirements on an On chip Clock (OCC) controller in multi-clock domain design, for example. To solve these issues, a Launch on Extra/Extended Shift (LOES) method can be used, which launches a transition with the help of an extra fast shift clock. In LOES, extra shift and capture clocks are at-speed clocks. Essentially, loading unloading processes of LOES are similar to LOC whereas launching process is similar to LOS since the transition is launched through the shift path.

SUMMARY

This disclosure relates to a dynamic core data register circuit where separate scan-enable signals facilitate delay fault testing of pseudo static controls.

In one example, a circuit includes a dynamic core data register (DCDR) cell that includes a data register, a shift register and an output circuit to route the output state of the data register or the shift register to an output of the DCDR in response to an output control input. The output of the shift register drives the input of the data register. A clock gate having a gate control input controls clocking of the shift register in response to a first scan enable signal. An output control gate controls the output control input of the output circuit. The output control gate controls which outputs from the data register or the shift register are transferred to an output of the output circuit in response to a second scan enable signal. The first scan enable signal and the second scan enable signal to enable a state transition of the shift register at the output of the DCDR.

In another example, a circuit includes a pipeline circuit having a delay circuit to generate a first scan enable signal that is delayed in time from a second scan enable signal to facilitate delay fault testing of a control line. The first scan enable signal is generated in response to a clocking of the second scan enable signal through the delay circuit. A dynamic core data register (DCDR) controls which outputs from a data register or a shift register are transferred to an output of the DCDR in response to the second scan enable signal. The first scan enable signal enables a state transition of the shift register at the output of the DCDR based on the second scan enable signal.

In yet another example, a method includes enabling a shift register of a dynamic core data register (DCDR) to drive an output of the DCDR in response to a scan enable signal. The method includes controlling a clock gate of the DCDR via a separate scan enable signal to cause an output transition of the shift register in the DCDR. The method includes generating an output transition of the shift register in response to a clock signal passed through the clock gate. The output transition of the shift register appears at the output of the DCDR in response to the scan enable signal.

DETAILED DESCRIPTION

This disclosure relates to a dynamic core data register (DCDR) circuit where separate scan enable signals facilitate delay fault testing of a pseudo static control signal. Delay fault testing refers to causing a state transition in the DCDR and to detect whether or not the transition occurred In previous DCDR implementations, a single scan enable signal was used for both clock gating in the DCDR and for control of which register output was provided at the output of the DCDR. Due to the single level of control provided by the scan enable signal, an output transition of an internal shift register was blocked from being observed at the DCDR output. As such, only static testing of the pseudo static control was performed since state transitions could not be observed. This limited the overall transition fault test coverage of the circuit since delay fault testing could not be performed faults on the pseudo static controls.

In this disclosure, separate scan enable signals are provided to the DCDR to allow delay fault testing of the DCDR. One scan enable signal is employed to control a clock gate driving the shift register in the DCDR and a separate scan enable signal is employed to control which output of the shift register or the data register appear at the output of the DCDR. By controlling the DCDR in this manner, transitions of the shift register can be observed at the output of the DCDR. A pipeline circuit can be provided to control the timing between the separate scan enable signals where one of the scan enable signals can be delayed with respect to another of the scan enable signals to facilitate fault transition testing. Such pipeline timing can be provided according to a launch on extra/extended shift (LOES) timing pattern to generate the output transition where at least two clock pulses of a test clock are generated to perform the delay fault testing of the shift register.

Figure 1:
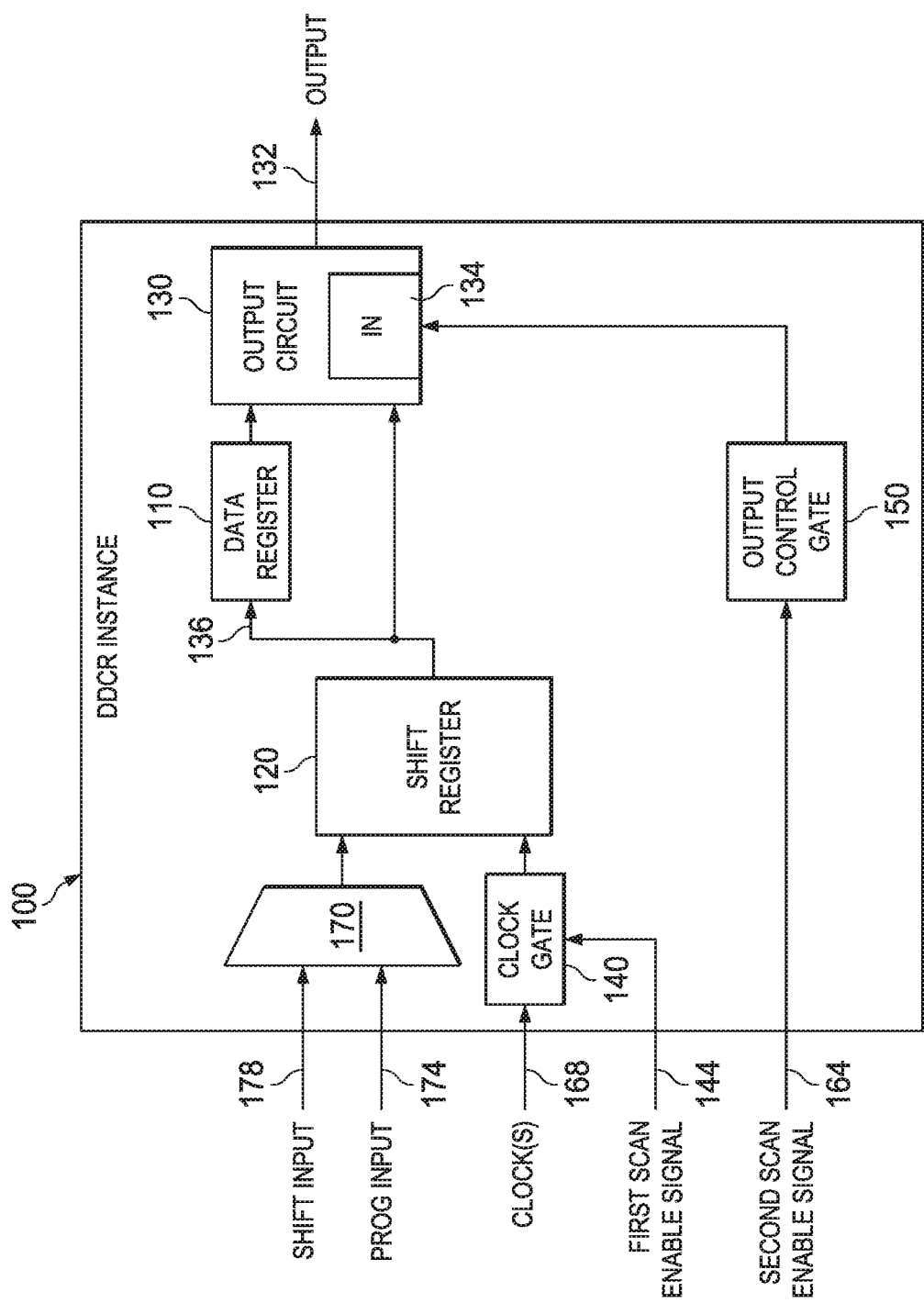
FIG. 1 illustrates an example block diagram of a dynamic core data register circuit where separate scan enable signals facilitate delay fault testing of a pseudo static control signal.

FIG. 1 illustrates an example of a dynamic core data register (DCDR) circuit 100 where separate scan enable signals facilitate delay fault testing of a pseudo static control. As used herein, the term "circuit" can include a collection of active and/or passive elements that perform a circuit function, such as an analog circuit or control circuit. Additionally or alternatively, for example, the term "circuit" can include an integrated circuit (IC) where all and/or some of the circuit elements are fabricated on a common substrate (e.g., semiconductor substrate).

The DCDR 100 includes a data register 110, a shift register 120, and an output circuit 130 to route the output state of the data register or the shift register to an output 132 of the DCDR in response to an output control input 134. As used herein, the term DCDR refers to a circuit that is used to override normal circuit functions for a signal such that testing of the signal can occur. Such signals can include a pseudo static controls which appear at the output 132 of the DCDR and are manipulated via data register 110 and the shift register 120. The term "pseudo static" refers to a signal that remains in mostly a static state yet can still transition when circuit control operations change. The DCDR 100 can be used to allow testing of correlated integrated circuit designs (see e.g., FIG. 3) that are driven from the pseudo static controls.

An output 1364 of the shift register 120 drives the input of the data register 110. A clock gate 140 having a gate control input controls clocking of the shift register 120 in response to a first scan enable signal 144. An output control gate 150 controls the output control input 134 of the output circuit 130. The output control gate 150 controls which outputs from the data register 110 or the shift register 120 are transferred to the output 132 of the output circuit 130 in response to a second scan enable signal 164 and to facilitate delay fault testing. Delay fault testing has two phases—shift and capture. During shift, the scan enable 144 and 164 is held high and shift clocks are pulsed. At this time, the output 132 of DCDR is driven by the data register 110 which remains static. During capture, there are two clock pulses applied (see e.g., FIG. 4)—launch & capture pulses. With launch on extra/extended shift protocol (LOES), the first scan enable 144 is asserted low between the launch and capture pulse. At this time, the output 132 is driven by the shift register 120 allowing the transition from shift register to propagate through the output 132.

The first scan enable signal 144 is delayed from the second scan enable signal 164 to provide a state transition of the shift register 120 at the output 132. By providing the first scan enable signal 144 and the separate scan enable signals 164, state transition timing of the shift register 120 is decoupled from the control of which output from either of the shift register 120 or the data register 110 appear at the DCDR output 132. In this manner, when a state transition is initiated in accordance with a clock signal 168 and the first scan enable signal 144, the output circuit 130 can be controlled to route the transition from the shift register 120 via the second scan enable signal 164. This transition capture was not possible in previous DCDR implementations that used a single scan enable signal to control both the clock gate 140 and the output circuit 130.

A pipeline circuit (see e.g., FIG. 3) can include a delay circuit to delay the first scan enable signal with respect to the second scan enable signal. The delay circuit can include a flip flop to clock the second scan enable signal to an output of the flip flop in response to a clock signal. The pipeline circuit can also include a gate at the output of the flip flop that is controlled by an enable signal to control the activation and deactivation of the first scan enable signal. In some examples, the shift register 120 can receive its input from a multiplexor 170 that multiplexes between a programming input 174 to set the pseudo static control state of the data register 110 via the shift register 120 during testing of a circuit under test. A shift input 174 receives input from a previous DCDR stage and is activated via the multiplexor 178 to cause a state transition of the shift register 120 at the output 132 which acts as a transition of the pseudo static control to the circuit under test. The pseudo static control which can be simulated via control of the shift register 120 and the scan enable signals 144 and 164, can be derived from a test enable control, a reset control, and a power isolation (ISO) control, for example.

The clock gate 140 can receive multiple clocks 168 from a multiplexer (see e.g., M2 of FIG. 2) that is controlled from automatic test equipment (ATE) (not shown). One of the multiple clocks includes a test clock that is provided to the shift register 120 during delay fault testing of the shift register. The output control gate 150 gates the second scan enable signal 164 to the output circuit 130 in response to a test control signal from the automated testing system (see e.g., DTC_CNTRLEN of FIG. 2). At least two clock pulses of the test clock can be generated to perform the delay fault testing of the shift register 120. One clock pulse can launch the beginning of an output transition of the shift register 120 and a second clock pulse enables downstream logic in the circuit under test to respond to the transition via the output 132.

Figure 4:
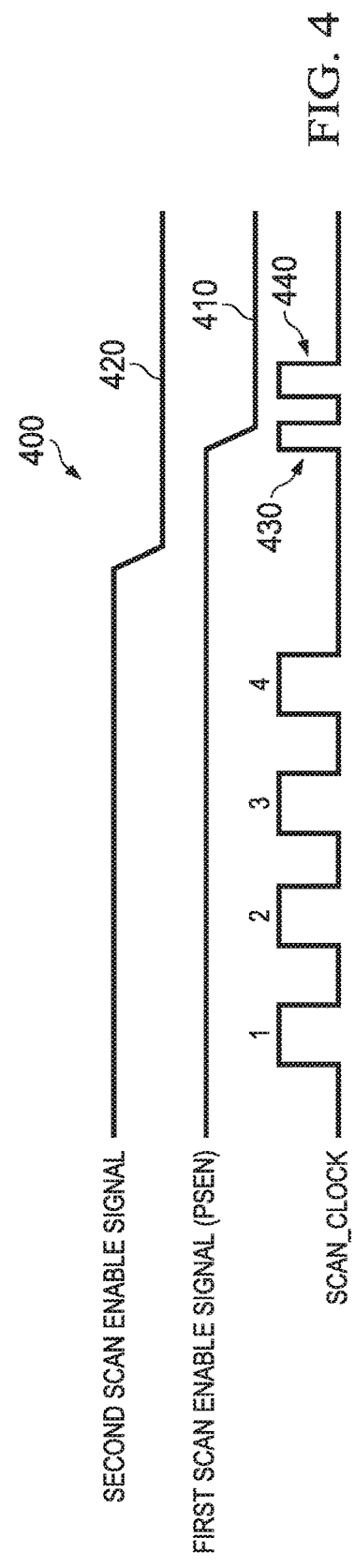
FIG. 4 illustrates an example timing diagram for the pipeline circuit of FIG. 3.

The delay fault testing can be operated according to a launch on extra/extended shift (LOES) timing pattern to generate the output transition, for example (see e.g., timing pattern of FIG. 4). Delay faults can be recorded in internal register in the circuit under test to record the transition from the shift register. In another example, automatic test equipment can monitor the response of a transition from the shift register in the downstream circuit under to detect a delay fault. In one specific example, the DCDR 100 can be an IEEE 1500-based instance of the cell that is modified to receive the first and second scan enable signal.

Figure 2:
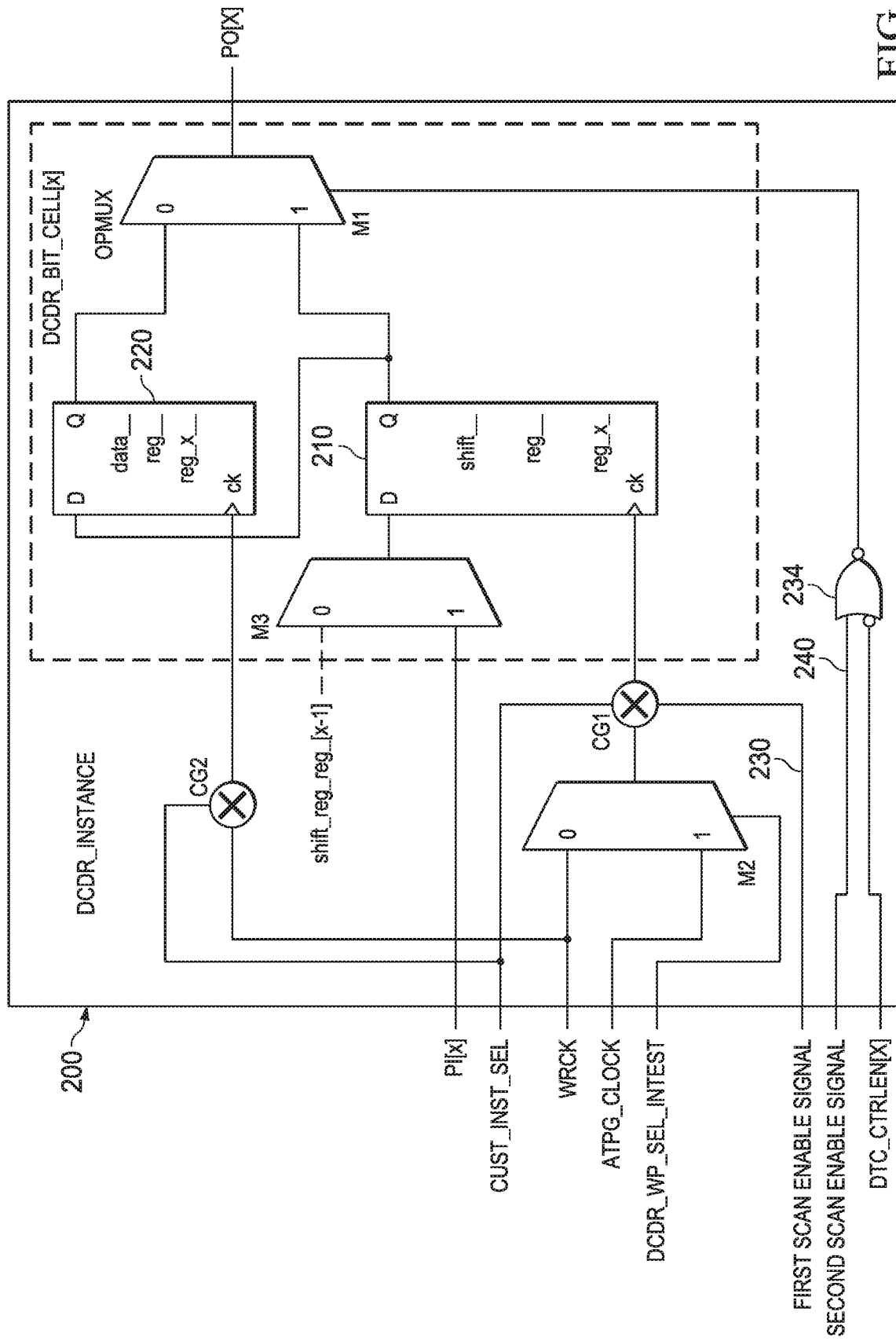
FIG. 2 illustrates an example schematic diagram of a dynamic core data register circuit where separate scan enable signals facilitate delay fault testing of a pseudo static control signal.

FIG. 2 illustrates an example of a dynamic core data register (DCDR) circuit 200 where separate scan enable signals facilitate delay fault testing of a pseudo static control. Pseudo static controls such as test-enable overrides, reset control overrides, ISO controls, and so forth are observed to contribute to 1-3% of the overall fault coverage of a given integrated circuit design. Given the pseudo static nature of these controls, they do generally do not have to be tested at-speed. However, slower-speed delay fault coverage is valid for these paths to detect gross defects. These controls can be generally implemented using a modified IEEE 1500 based Dynamic Core Data Register (DCDR) 200 such as shown in the example of FIG. 2. An 'N' bit DCDR instance contains 'N' DCDR bit cells each containing a shift register 210 and a data register 220 along with a multiplexor M1 operating as the output circuit and a clock gate shown as CG1. A separate clock gate CG2 can be provided for the data register 220.

The DCDR 200 can be programmed by selecting the corresponding IR (Instruction Register) value and asserting a select signal from an automated test equipment (ATE) (not shown). The desired pseudo static data is then shifted in through the shift registers 210 via program input PI[x] and then loaded on to the data register 220 by updateDR event initiated by the ATE. The value on the data register 220 remains static throughout the test. The shift registers 210 are also configured to be part of a test scan. Hence, after the initialization phase, the clock to the shift registers can be switched to an ATPG clock (e.g., test clock) via multiplexer M2 which is controlled via signal DCDR_WP_SEL_INTEST. A first scan enable signal 230 controls the clock gate CG1.

The selection of output either from data register 220 or shift register 210 is controlled control gate 234 by a combination of a second scan enable signal 240 and Dynamic Toggle Control (DTC) signal. If DTC=0, the DCDR output PO(x) is controlled by the data registers. If DTC=1, during scan-shift when the first scan enable signal is high, the control is through the data register 220 and during scan-capture when the signal is low, the control is through the shift register 210 which holds the last shifted-in value. A multiplexor M3 can be provided to multiplex the input of the shift register 210 between the programming input PI(x) and another input that can represent data from a preceding DCDR element shift register which is part of the chain. CG2 can be controlled via signal CUST_INST_SEL. The multiplexor M2 can be multiplex between the ATPG_CLOCK or a system functional clock WRCK.

With the modified DCDR circuit 200, since CG1 is controlled by the pipelined first scan enable 230 (see e.g., FIG. 3) which is high during the launch edge, the extra shift clock to support LOES testing is allowed to reach the shift register 210 in order for it to create the launch transition. Since M1 is now controlled by the second scan enable signal 240 which remains low during the launch edge, the select line of M1 is set to 1 thereby allowing the transition to propagate through the multiplexor. By virtue of this, delay defect fault coverage is enabled on the pseudo static control lines using LOES-based delay testing. The circuits described herein were implemented on 45 nm AR16xx SoC consisting of 800K flops and 10 million gates. The target delay fault test coverage was 95%. The multi-scan enable controls described herein helped increase the coverage by 1-2% by covering faults on the pseudo static control lines. Thus, the total delay fault test coverage improved to 96.17%.

Figure 3:
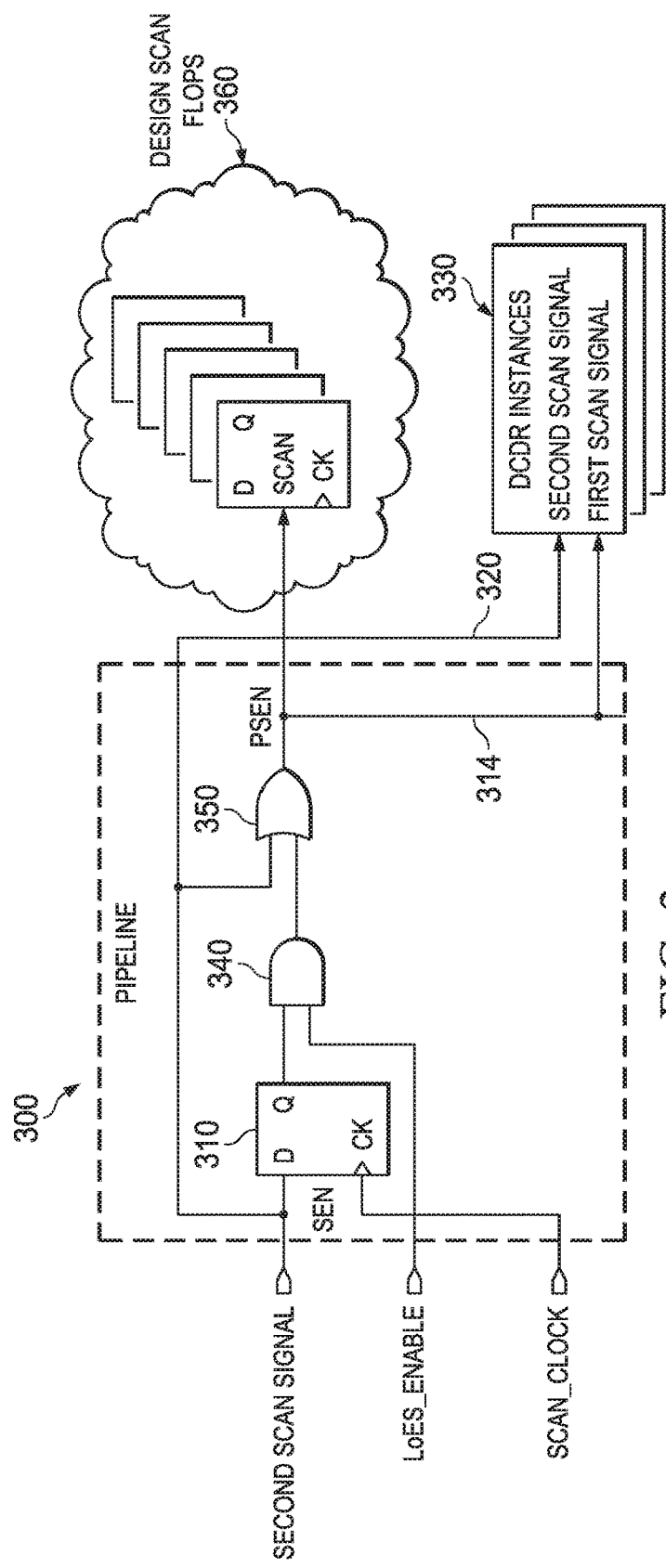
FIG. 3 illustrates an example of a pipeline circuit for generating scan enable signals to facilitate delay fault testing of a pseudo static control signal.

FIG. 3 illustrates an example of a pipeline circuit 300 for generating scan enable signals to facilitate delay fault testing of a pseudo static control. The pipeline circuit 300 includes a delay circuit 310 to delay a first scan enable signal generated at 314 with respect to a second scan enable signal 320, each of which drive a one or more DCDR instances at 330. In this example, the delay circuit 310 can be a flip flop to clock the second scan enable signal 320 to an output Q of the flip flop in response to a clock signal shown as SCAN_CLOCK. The pipeline circuit 300 includes a gate 340 at the output of the flip flop that is controlled by an enable signal (LOES_ENABLE) to control the activation and deactivation of the first scan enable signal 314. An output gate 350 gates the first scan enable signal 314 based on inputs driven from the second scan enable signal 320 and output from gate 340. As shown, one or more integrated circuit scan flops 360 can be operated in accordance with the first scan enable signal 314, where the DCDR instances 330 enable testing of the pseudo static controls of the integrated circuits.

FIG. 4 illustrates an example timing diagram 400 for the pipeline circuit of FIG. 3. A timing relationship is shown between the first scan enable signal at 410 and the second scan enable signal at 420 which triggers the LOES testing described herein when the signal goes from high to low. At least two clock pulses of a test clock can be generated to perform the delay fault testing of the shift register described herein. One clock pulse 430 launches the capture of the shift register and a second clock pulse 440 propagates the transition from the shift register at the output of the DCDR to downstream circuits under test.

Figure 5:
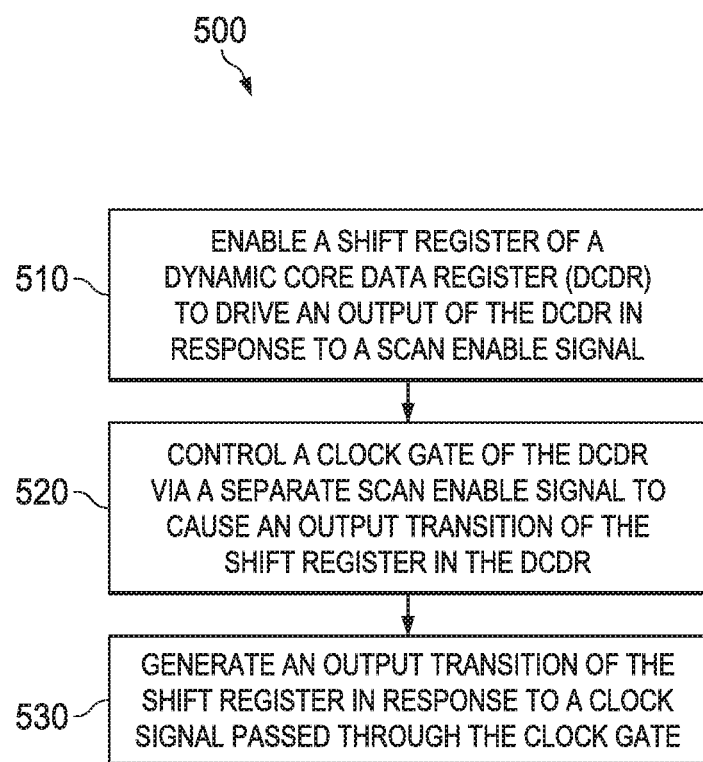
FIG. 5 illustrates an example method to facilitate delay fault testing of a pseudo static control signal.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured as machine readable instructions stored in memory and executable in an integrated circuit or a processor, for example.

FIG. 5 illustrates an example method 500 to facilitate delay fault testing of a pseudo static control signal. At 510, the method 500 includes enabling a shift register of a dynamic core data register (DCDR) to drive an output of the DCDR in response to a scan enable signal. At 530, the method 500 includes controlling a clock gate of the DCDR via a separate scan enable signal to cause an output transition of the shift register in the DCDR. At 530, the method includes generating an output transition of the shift register in response to a clock signal passed through the clock gate. The output transition of the shift register appears at the output of the DCDR in response to the scan enable signal. Although not shown, the method can also include delaying the separate scan enable signal from the scan enable signal to enable a state transition of the shift register to appear at the output of the DCDR.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
   a dynamic core data register (DCDR), comprising:
      a data register;
      a shift register; and
      an output circuit configured to route an output state of the data register or of the shift register to an output of the DCDR in response to an output control input, wherein the output of the shift register is configured to drive an input of the data register;
   a clock gate having a gate control input, the clock gate configured to:
      receive a first scan enable signal at the gate control input; and
      control clocking of the shift register in response to the first scan enable signal; and
   an output control gate having an output control input, the output control gate configured to:
      receive a second scan enable signal at the output control input; and
      control which outputs from the data register or the shift register are transferred to the output of the DCDR in response to the second scan enable signal.

2. The circuit of claim 1, further comprising a pipeline circuit that includes a delay circuit to delay the first scan enable signal with respect to the second scan enable signal.

3. The circuit of claim 2, wherein the delay circuit includes a flip flop to clock the second scan enable signal to an output of the flip flop in response to a clock signal.

4. The circuit of claim 3, wherein the pipeline circuit includes a gate at the output of the flip flop that is controlled by an enable signal to control activation and deactivation of the first scan enable signal.

5. The circuit of claim 1, wherein the shift register receives its input from a multiplexor that multiplexes between a programming input to set a state of a pseudo static control into the data register via the shift register and a shift input from a previous DDCR stage that is utilized to cause a transition at the output of the shift register during delay fault testing of the pseudo static control.

6. The circuit of claim 5, wherein the pseudo static control is derived from at least one of a test enable control, a reset control, and a power isolation (ISO) control.

7. The circuit of claim 6, wherein the clock gate receives multiple clocks from a multiplexer that is controlled from automated test equipment (ATE), one of the multiple clocks includes a test clock that is provided to the shift register during delay fault testing of the shift register.

8. The circuit of claim 7, wherein the output control gate gates the second scan enable signal to the output circuit in response to a test control signal from the ATE.

9. The circuit of claim 7, wherein at least two clock pulses of the test clock are generated to perform the delay fault testing of the shift register, one clock pulse to initiate a launch pulse for a transition of the shift register and a second clock pulse to initiate a capture pulse of the transition in a circuit under test.

10. The circuit of claim 9, wherein the delay fault testing is operated according to a launch on extra/extended shift (LOES) timing pattern to generate the launch and capture pulses.

11. The circuit of claim 9, further comprising an internal register in the circuit under test to record the transition from the shift register or automatic test equipment to monitor the transition from the shift register to detect a delay fault.

12. The circuit of claim 1, wherein the DCDR is an IEEE 1500-based instance of a cell that is modified to receive the first and second scan enable signal.

13. A method, comprising:
   receiving, by a clock gate of a dynamic core data register (DCDR), a first scan enable signal;
   controlling, by the clock gate, clocking of a shift register of the DCDR to drive an output of the DCDR in response to the first scan enable signal;
   receiving, by an output control gate of the DCDR, a second scan enable signal; and
   controlling, by the output control gate, which output of the shift register to output by the DCDR, in response to the second scan enable signal.

14. The method of claim 13, further comprising delaying the second scan enable signal relative to the scan first enable signal to enable a state transition of the shift register to appear at the output of the DCDR.

15. The method of claim 13, further comprising:
   receiving, by the shift register, input from a multiplexer; and
   multiplexing, by the multiplexer, between a programming input and a shift input.

* * * * *